(12) United States Patent
Chen et al.

(10) Patent No.: US 8,891,238 B2
(45) Date of Patent: Nov. 18, 2014

(54) ELECTRONIC DEVICE WITH DETACHABLE COMMUNICATION MODULE

(75) Inventors: Yi-Liang Chen, Taipei (TW); Ming-Wei Yu, Taipei (TW)

(73) Assignee: Primax Electronics Ltd., Taipei (TW)

( * ) Notice: Subject to any disclaimer, the term of this patent is extended or adjusted under 35 U.S.C. 154(b) by 371 days.

(21) Appl. No.: 13/560,691

(22) Filed: Jul. 27, 2012

(65) Prior Publication Data

US 2013/0301226 A1    Nov. 14, 2013

(30) Foreign Application Priority Data

May 11, 2012 (TW) .............................. 101116928 A

(51) Int. Cl.
*G06F 1/16* (2006.01)

(52) U.S. Cl.
USPC ................. 361/679.58; 361/679.41; 361/728; 361/731

(58) Field of Classification Search
USPC ........................................ 361/679.41, 679.58
See application file for complete search history.

(56) References Cited

U.S. PATENT DOCUMENTS

| | | | |
|---|---|---|---|
| 5,229,701 A * | 7/1993 | Leman et al. ................. | 320/115 |
| 5,579,487 A * | 11/1996 | Meyerson et al. ............ | 710/100 |
| 5,839,097 A * | 11/1998 | Klausner ...................... | 340/12.3 |
| 6,065,679 A * | 5/2000 | Levie et al. ............... | 235/462.47 |
| 6,717,801 B1 * | 4/2004 | Castell et al. ............. | 361/679.41 |
| 6,762,585 B2 * | 7/2004 | Liao .............................. | 320/107 |
| 7,920,377 B2 * | 4/2011 | Kaply et al. ............... | 361/679.4 |
| 8,077,453 B2 * | 12/2011 | Swan et al. ............... | 361/679.41 |
| 2011/0054267 A1 * | 3/2011 | Fidacaro et al. .............. | 600/300 |
| 2011/0085287 A1 * | 4/2011 | Ebrom et al. ............ | 361/679.01 |

* cited by examiner

*Primary Examiner* — Anthony Q Edwards

(74) *Attorney, Agent, or Firm* — Kirton McConkie; Evan R. Witt

(57) ABSTRACT

An electronic device with a detachable communication module is provided. The electronic device includes an electronic device casing and the communication module. The electronic device casing includes a receiving space and an opening. The communication module includes a covering plate, a fixing plate, a first circuit board, and a first connector. The covering plate has an aperture. The first connector has a connecting port. Moreover, the first circuit board is connected with a supporting member. The first connector is connected with the first circuit board. The connecting port is exposed to the aperture of the covering plate. After the first circuit board and the first connector are accommodated within the receiving space, the opening of the electronic device casing is covered by the covering plate. Moreover, by the fixing plate, the communication module is fixed on the electronic device casing.

10 Claims, 9 Drawing Sheets

ELECTRONIC DEVICE WITH DETACHABLE COMMUNICATION MODULE

FIELD OF THE INVENTION

The present invention relates to an electronic device, and more particularly to an electronic device with a detachable communication module.

BACKGROUND OF THE INVENTION

An electronic device such as a notebook computer, a printing device or a scanning device is usually equipped with a built-in communication module in order to transfer data or to be used as a network printing device or a network scanning device.

Conventionally, during the electronic device is assembled in the factory, the communication module is sealed and fixed within the casing of the electronic device. In a case that the communication module has a breakdown, the user fails to disassemble the communication module from the electronic device. In other words, the electronic device should be sent to the original factory, and thus the communication module is replaced with a new one. Consequently, the use of the conventional electronic device is troublesome to the user and increases the cost burden on the user. For solving the drawbacks, an electronic device with a detachable communication module is introduced into the market.

Hereinafter, an electronic device with a detachable communication module will be illustrated with reference to FIG. 1. FIG. 1 is a schematic perspective view illustrating an electronic device with a detachable communication module according to the prior art. For example, the electronic device 1 is a notebook computer. As shown in FIG. 1, The notebook computer 1 comprises a top cover 11, a base 12, a motherboard 13, an outer connecting part opening 14, a base opening 15, a communication module 16, a fastening device 17, and a bottom cover 18.

The base 12 comprises a lateral plate 12a and a bottom plate 12b. The motherboard 13 comprises an insertion slot 13a. The communication module 16 comprises an outer connecting part 16a, a cable 16b, a connector 16c, and a communication card 16d. The outer connecting part 16a has a wiring hole 16aa.

The assembling sequence of the conventional electronic device with a detachable communication module will be illustrated as follows.

Firstly, an end of the top cover 11 is pivotally coupled with an end of the base 12, so that the top cover 11 is rotatable relative to the base 12.

Next, the motherboard 13 is disposed within the base 12, wherein the outer connecting part opening 14 is formed in the lateral plate 12a of the base 12, and the base opening 15 is formed in the bottom plate 12b of the base 12.

Next, the outer connecting part 16a is connected with the connector 16c through the cable 16b, the connector 16c is connected with the communication card 16d, and the communication card 16d is inserted into the insertion slot 13a of the motherboard 13. Consequently, the communication card 16d is electrically connected with the outer connecting part 16a.

Moreover, the outer connecting part 16a is fixed within the outer connecting part opening 14 through the fastening device 17.

Afterwards, the bottom cover 18 is tightly fitted into the base opening 15 to cover the base opening 15. Consequently, the communication card 16d is isolated from the surroundings.

A process for disassembling the communication module from the electronic device and a process for assembling the communication module into the electronic device will be illustrated in more details as follows.

For disassembling the communication module 16, the bottom cover 18 is firstly detached from the base opening 15. Then the communication card 16d is disconnected from the insertion slot 13a of the motherboard 13, and the connector 16c is disconnected from the communication card 16d. Then, the fastening device 17 is removed. After the combination of the outer connecting part 16a, the cable 16b and the connector 16c is taken out from the outer connecting part opening 14, the process of disassembling the communication module 16 is completed.

Whereas, for installing the communication module 16, the cable 16b and the connector 16c are firstly introduced into the internal portion of the base 12 through the outer connecting part opening 14. Then, the outer connecting part 16a is fixed within the outer connecting part opening 14 through the fastening device 17. Then, the communication card 16d is inserted into the insertion slot 13a of the motherboard 13, and the communication card 16d is connected with the connector 16c.

However, the conventional electronic device 1 with a detachable communication module still has some drawbacks.

As previously described, during the communication module 16 is disassembled by the user, at least four steps are necessary. That is, the bottom cover 18 is opened, the communication card 16d is disconnected, the fastening device 17 is removed, and the combination of the outer connecting part 16a, the cable 16b and the connector 16c is taken out from the outer connecting part opening 14. In other words, the user fails to quickly replace the communication module 16. If the user wants to disassemble the communication module 16 at the first time, the user fails to realize the operating way intuitively. That is, the process of disassembling the communication module is troublesome and time-consuming.

Therefore, there is a need of providing an improved electronic device with a detachable communication module in order to eliminate the above drawbacks.

SUMMARY OF THE INVENTION

The present invention provides an electronic device with a detachable communication module, in which the communication module can be quickly disassembled from and assembled into the electronic device.

In accordance with an aspect of the present invention, there is provided an electronic device with a detachable communication module. The electronic device includes an electronic device casing and the communication module. The electronic device casing includes a receiving space and an opening. The communication module includes a supporting member, a first circuit board, and a first connector. The supporting member includes a covering plate and a fixing plate. The covering plate has an aperture. The fixing plate is extended from the covering plate for fixing the communication module on the electronic device casing. The first circuit board is connected with the supporting member. The first connector is connected with the first circuit board, and includes a connecting port. The connecting port is exposed to the aperture of the covering plate. After the first circuit board and the first connector are placed within the receiving space, the opening is covered by the covering plate.

In an embodiment, the electronic device further includes a second connector and a second circuit board. The second connector is located at a distal end of the receiving space. The second circuit board is connected with the second connector for controlling operations of the electronic device. When the first circuit board is introduced into the receiving space, the first circuit board is connected with the second connector, so that the first circuit board is electrically connected with the second circuit board.

In an embodiment, the first circuit board is a network card, and the second circuit board is a motherboard of the electronic device.

In an embodiment, the electronic device further includes two sliding grooves, which are disposed within the receiving space. When the first circuit board is introduced into the receiving space, both sides of the first circuit board are respectively moved along the two sliding grooves to be accommodated within the receiving space.

In an embodiment, the first circuit board of the communication module has a fixing hole.

In an embodiment, the supporting member of the communication module further includes a fastening part and two lateral plates. The fastening part is located under the fixing plate and embedded into the fixing hole of the first circuit board. The two lateral plates are respectively extended from bilateral sides of the covering plate for fixing a location of the first circuit board.

In an embodiment, the fixing plate further includes a perforation.

In an embodiment, the communication module further includes a fixing element, which is accommodated within the perforation of the fixing plate. The fixing element includes a screw head part, a connecting part, and a thread part. An outer perimeter of the screw head part is larger than an inner perimeter of the perforation. The connecting part is extended from the screw head part and disposed within the perforation, wherein an outer perimeter of the connecting part is smaller than the inner perimeter of the perforation. The thread part is extended from the connecting part, wherein an outer perimeter of the thread part is larger than the inner perimeter of the perforation.

In an embodiment, the electronic device further includes a screwing hole, which is located over the receiving space. The thread part of the fixing element is penetrated through the screwing hole, so that the communication module is fixed on the electronic device casing.

In an embodiment, the electronic device is a label printer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
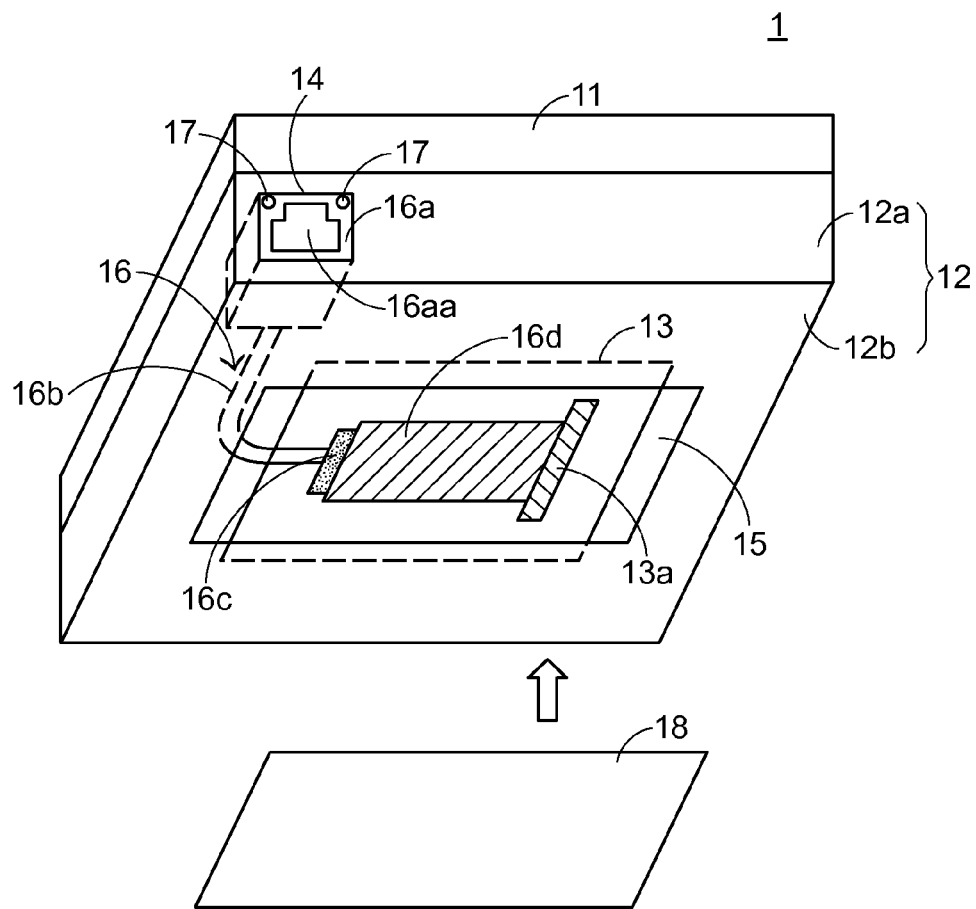
FIG. 1 is a schematic perspective view illustrating an electronic device with a detachable communication module according to the prior art.
Figure 2:
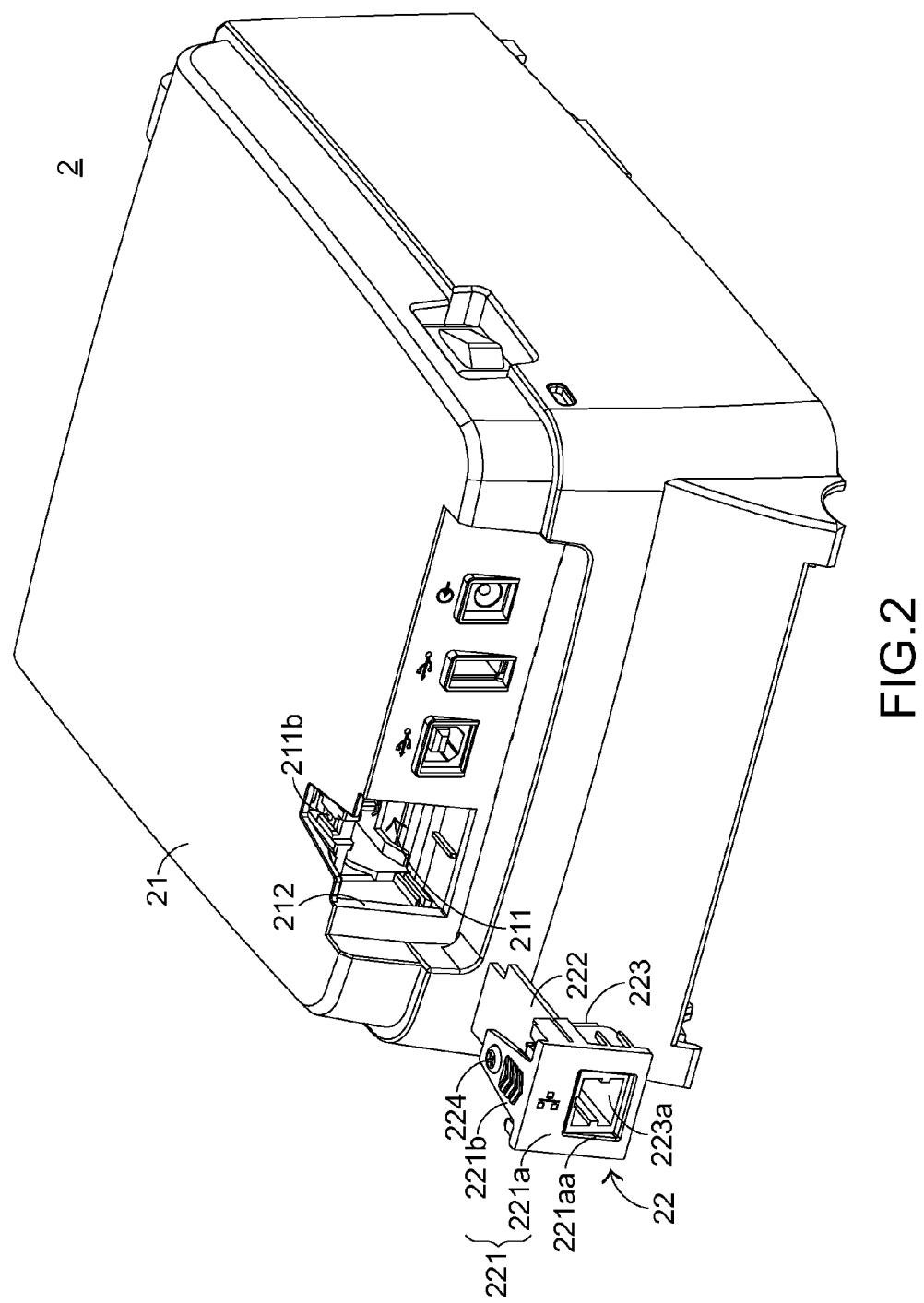
FIG. 2 is a schematic exploded view illustrating an electronic device with a detachable communication module according to an embodiment of the present invention.
Figure 3:
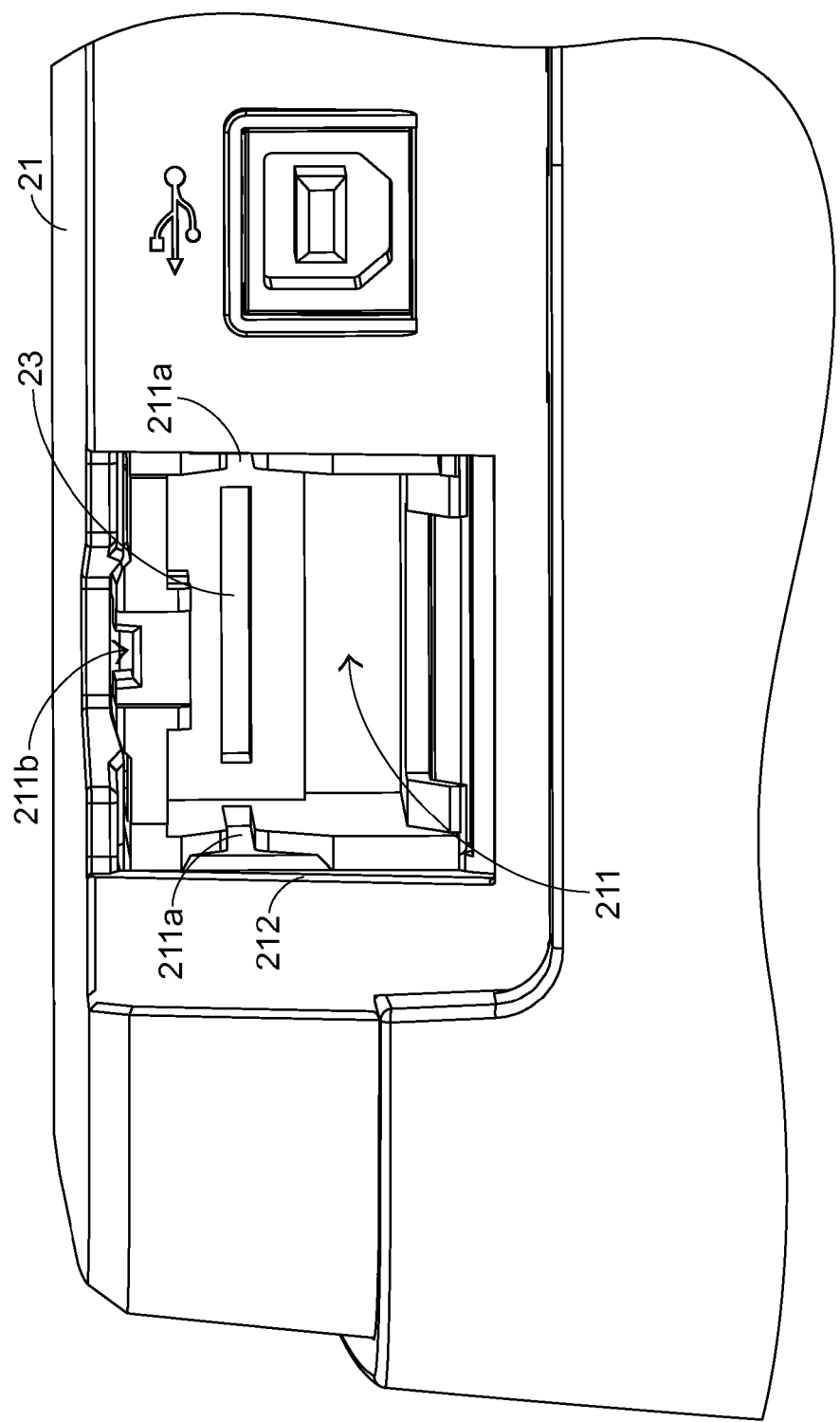
FIG. 3 is a schematic partial perspective view illustrating the receiving space of the electronic device according to the embodiment of the present invention.
Figure 4:
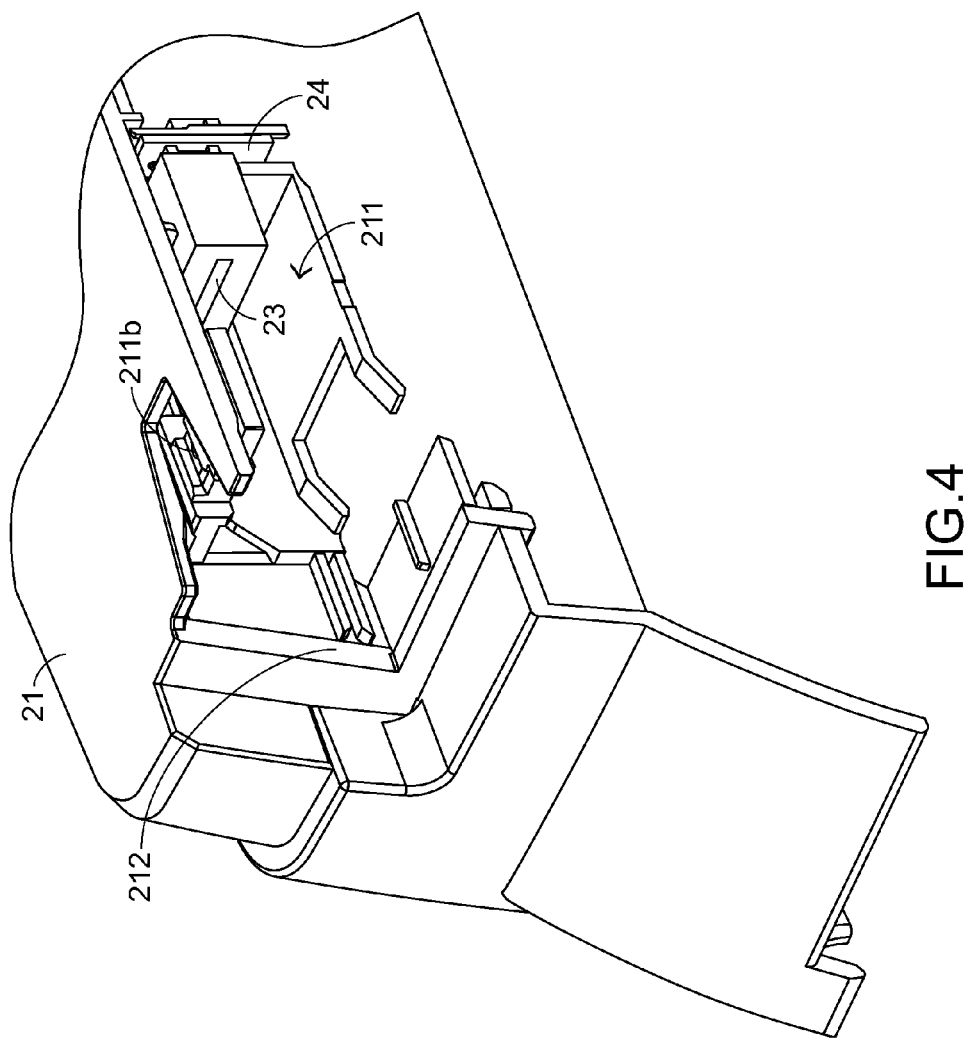
FIG. 4 is a schematic cutaway view illustrating the casing, the second connector and the second circuit board of the electronic device according to the embodiment of the present invention.
Figure 5:
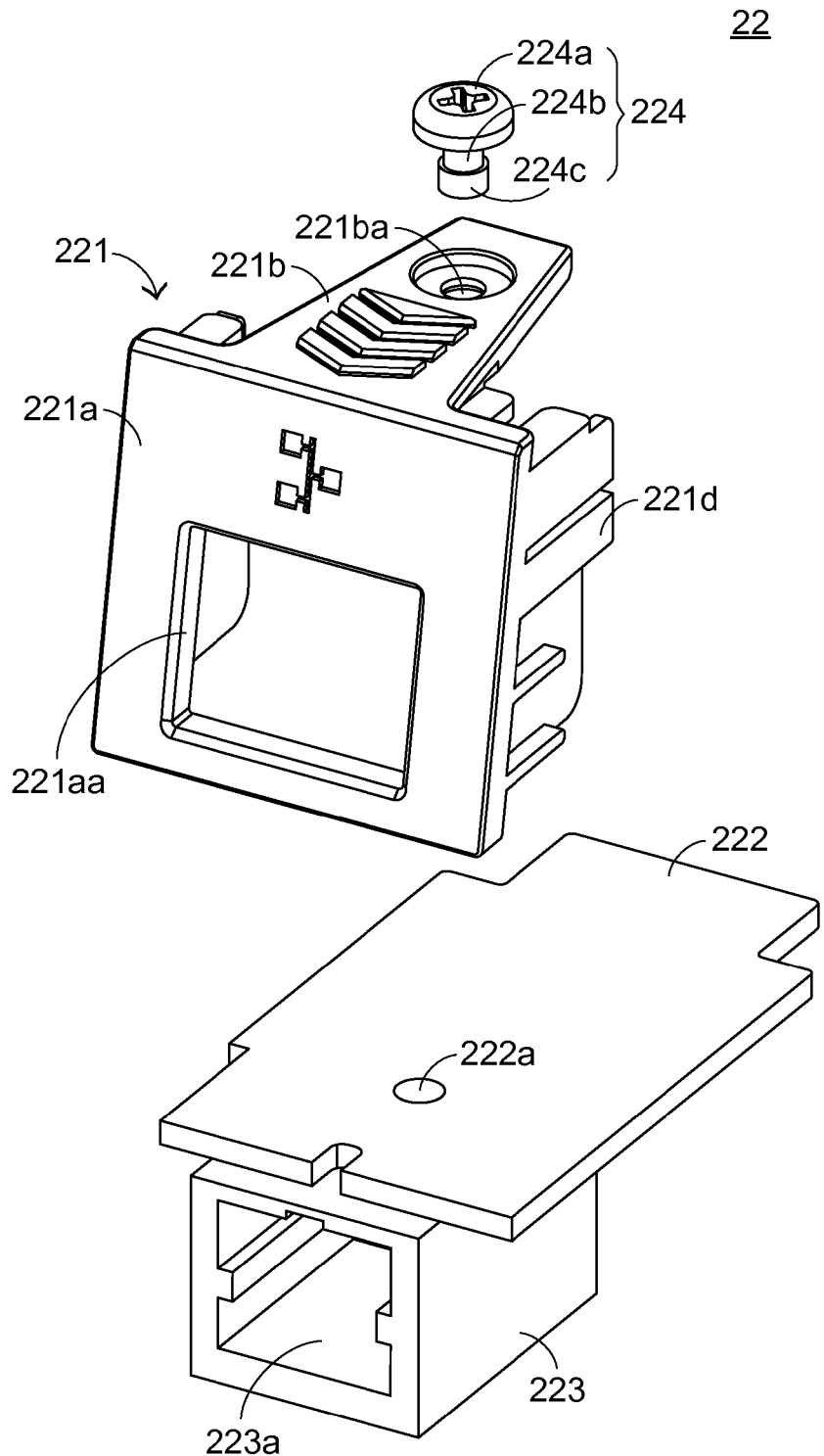
FIG. 5 is a schematic exploded view illustrating the communication module of the electronic device according to the embodiment of the present invention and taken along a first viewpoint.
Figure 6:
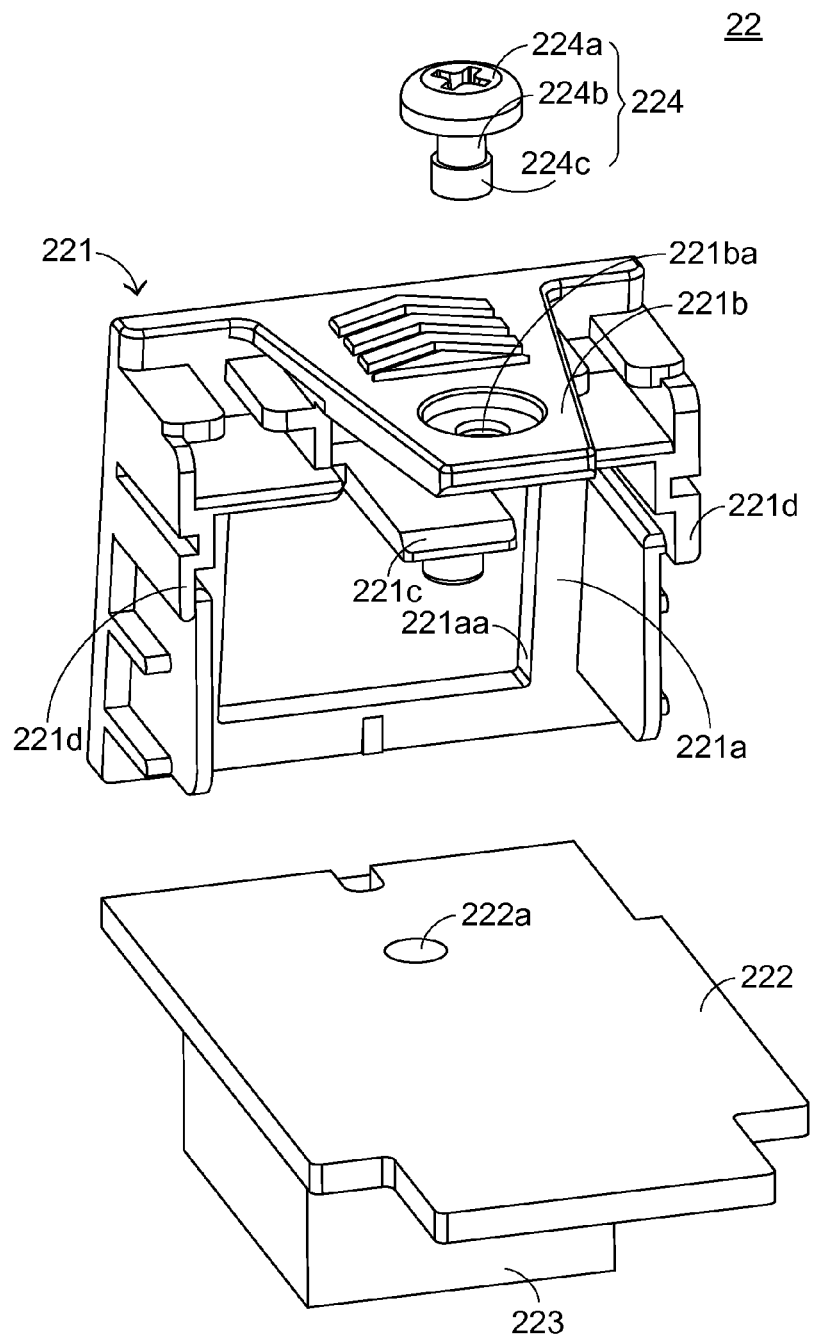
FIG. 6 is a schematic exploded view illustrating the communication module of the electronic device according to the embodiment of the present invention and taken along a second viewpoint.

Hereinafter, the configurations of an electronic device with a detachable communication module will be illustrated with reference to FIGS. 2-6. FIG. 2 is a schematic exploded view illustrating an electronic device with a detachable communication module according to an embodiment of the present invention. FIG. 3 is a schematic partial perspective view illustrating the receiving space of the electronic device according to the embodiment of the present invention. FIG. 4 is a schematic cutaway view illustrating the electronic device casing, the second connector and the second circuit board of the electronic device according to the embodiment of the present invention. FIG. 5 is a schematic exploded view illustrating the communication module of the electronic device according to the embodiment of the present invention and taken along a first viewpoint. FIG. 6 is a schematic exploded view illustrating the communication module of the electronic device according to the embodiment of the present invention and taken along a second viewpoint.

Please refer to FIGS. 2-6. The electronic device 2 comprises an electronic device casing 21, a communication module 22, a second connector 23, a second circuit board 24, two sliding grooves 211a, and a screwing hole 211b. The electronic device casing 21 has a receiving space 211 and an opening 212. The communication module 22 comprises a supporting member 221, a first circuit board 222, a first connector 223, and a fixing element 224.

Furthermore, the supporting member 221 comprises a covering plate 221a, a fixing plate 221b, a fastening part 221c, and two lateral plates 221d. The covering plate 221a has an aperture 221aa. The fixing plate 221b comprises a perforation 221ba. The fixing element 224 comprises a screw head part 224a, a connecting part 224b, and a thread part 224c. The connecting part 224b is extended from the screw head part 224a. The thread part 224c is extended from the connecting part 224b. The first circuit board 222 has a fixing hole 222a. In addition, the first connector 223 has a connecting port 223a.

Figure 7:
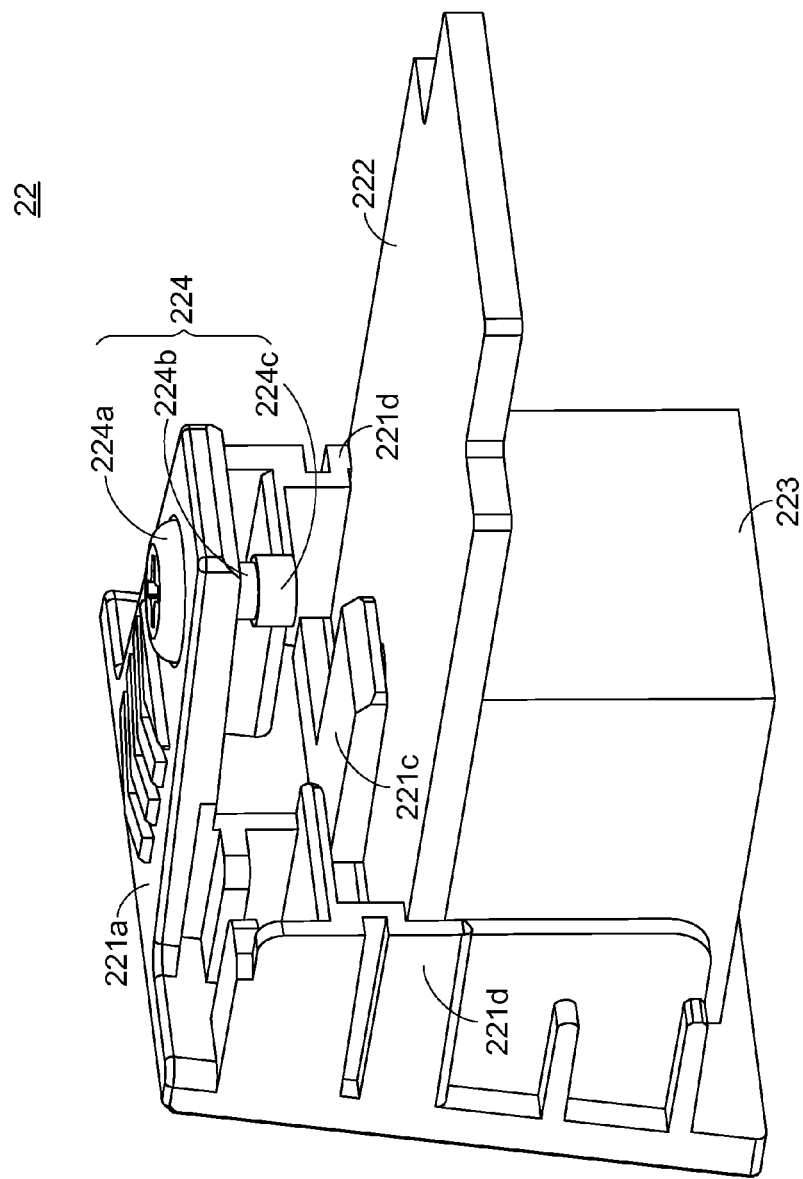
FIG. 7 is a schematic perspective view illustrating the communication module of the electronic device according to the embodiment of the present invention.

FIG. 7 is a schematic perspective view illustrating the communication module of the electronic device according to the embodiment of the present invention. Hereinafter, a sequence of assembling the electronic device 2 according to an embodiment of the present invention will be illustrated with reference to FIGS. 2, 5, 6 and 7.

Firstly, the fixing plate 221b of the supporting member 221 is extended from a top edge of the covering plate 221a, the two lateral plates 221d are respectively extended from bilateral sides of the covering plate 221a, and the fastening part 221c is extended from the covering plate 221a and located under the fixing plate 221b.

Next, the first connector 223 is connected with the first circuit board 222, and the fastening part 221c is embedded into the fixing hole 222a of the first circuit board 222. Moreover, the both sides of the first circuit board 222 are fixed by the two lateral plates 221d, respectively. As a consequence, the supporting member 221, the first circuit board 222 and the first connector 223 are integrated as a modularized structure. Under this circumstance, the connecting port 223a is exposed to the aperture 221aa of the covering plate 221a (see FIG. 2).

Furthermore, the fixing element 224 is penetrated through the perforation 221ba of the fixing plate 221b. In this embodiment, the outer perimeter of the connecting part 224b is smaller than the inner perimeter of the perforation 221ba, and each of the outer perimeters of the screw head part 224a and the thread part 224c is larger than the inner perimeter of the perforation 221ba. Consequently, the connecting part 224b is movable within the perforation 221ba. Moreover, due to the screw head part 224a and the thread part 224c, the fixing element 224 is not detached from the fixing plate 221b.

Furthermore, please refer to FIGS. 3 and 4 again. The two sliding grooves 211a are disposed within the receiving space 211. The screwing hole 211b is located over the receiving space 211. The second connector 23 is located at a distal end of the receiving space 211. The second circuit board 24 is connected with the second connector 23.

Figure 8:
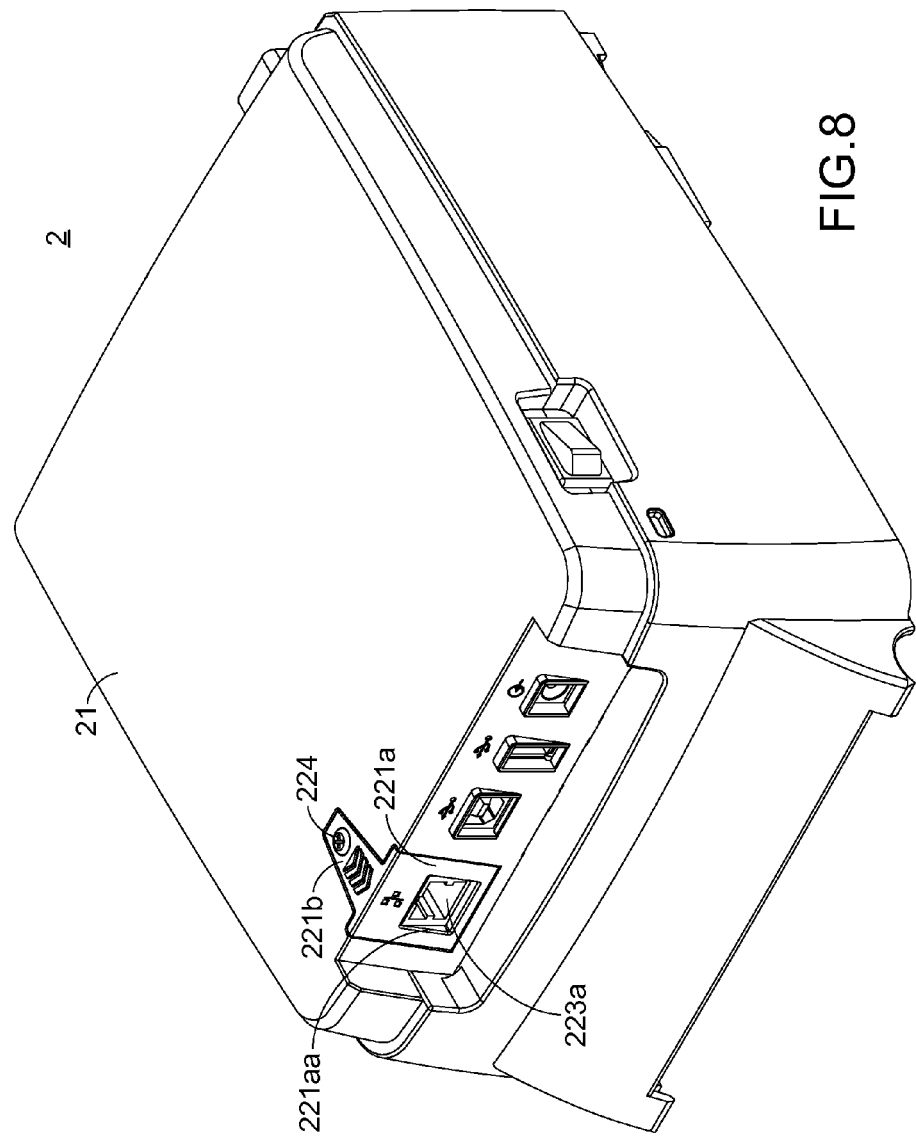
FIG. 8 is a schematic perspective view illustrating the electronic device according to the embodiment of the present invention.
Figure 9:
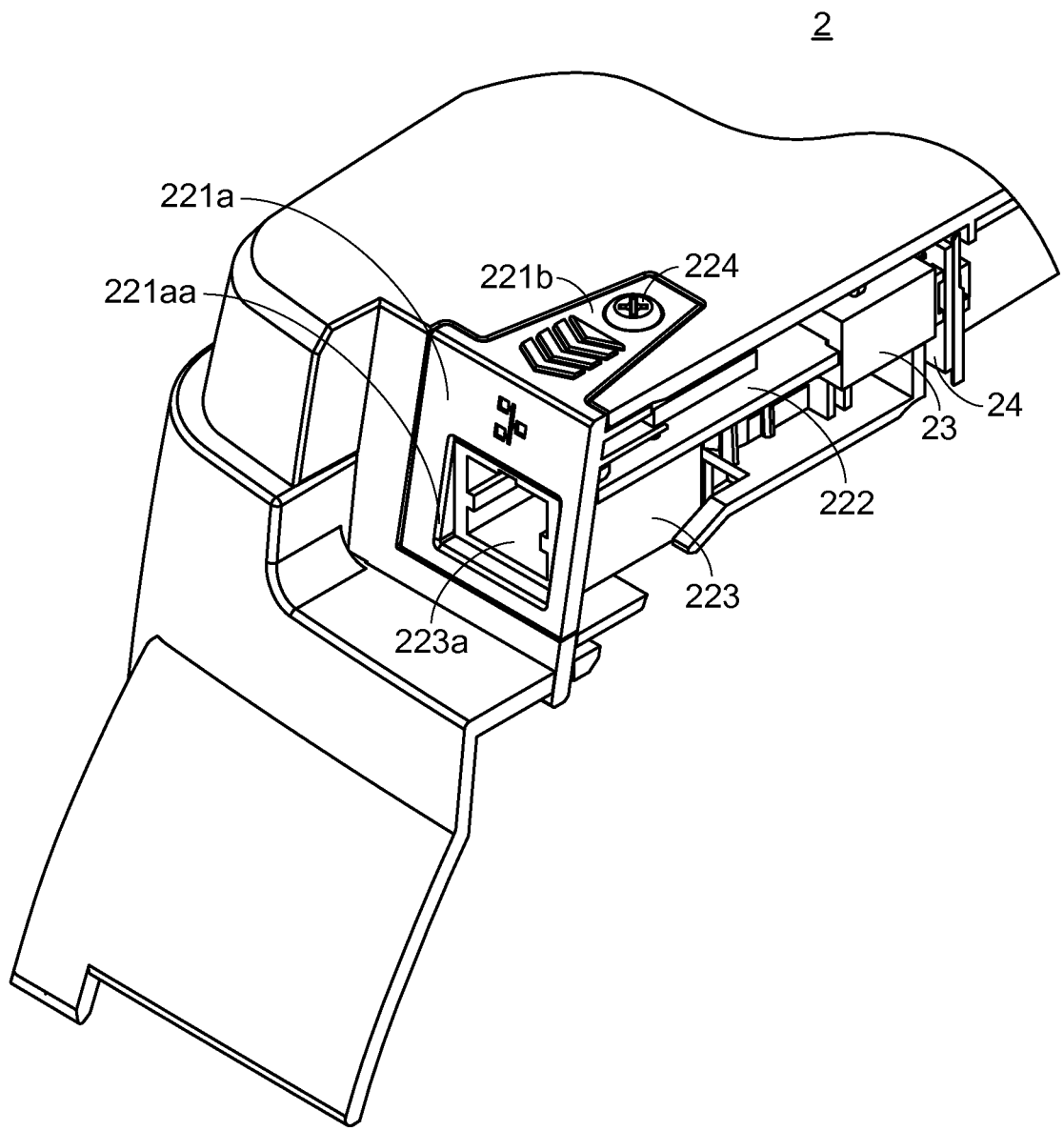
FIG. 9 is a schematic cutaway view illustrating the electronic device according to the embodiment of the present invention.

FIG. 8 is a schematic perspective view illustrating the electronic device according to the embodiment of the present invention. FIG. 9 is a schematic cutaway view illustrating the electronic device according to the embodiment of the present invention. Hereinafter, a process for disassembling the communication module from the electronic device and a process for assembling the communication module into the electronic device according to an embodiment of the present invention will be illustrated with reference FIGS. 2, 8 and 9.

For installing the communication module 22, the first circuit board 222 is firstly introduced into the receiving space 211. Moreover, by pushing the supporting member 221, the both sides of the first circuit board 222 are respectively moved along the two sliding grooves 211a (see FIG. 3) to be accommodated within the receiving space 211.

When the first circuit board 222 is pushed to the end of the receiving space 211, the first circuit board 222 is connected with the second connector 23. Under this circumstance, the opening 212 of the electronic device casing 21 is covered by the covering plate 221a of the supporting member 221, the first circuit board 222 and the first connector 223 are accommodated within the receiving space 211, and only the connecting port 223a is exposed outside the electronic device casing 21 through the aperture 221aa of the covering plate 221a.

Afterwards, the thread part 224c of the fixing element 224 is penetrated through the screwing hole 211b over the receiving space 211 and tightened, the communication module 22 is fixed on the electronic device casing 21.

On the other hand, it is very simple to disassemble the communication module 22. By detaching the fixing element 224 from the screwing hole 211b and moving the fixing plate 221b, the communication module 22 may be pulled out.

The operations of the electronic device according to an embodiment of the present invention will be illustrated as follows. In this embodiment, the electronic device 2 is a label printer. Alternatively, in some other embodiments, the electronic device 2 is a notebook computer, any other printing device or a scanning device. Moreover, in this embodiment, the first circuit board 222 is a network card, and the second circuit board 24 is a motherboard of the electronic device 2.

After the communication module 22 is installed in the electronic device 2, the user may inset a network cable into the connecting port 223a. Consequently, the electronic device 2 is linked to a network and served as a network label printer.

After the electronic device 2 is linked to the network, the user may order the electronic device 2 to perform a printing task through a computer terminal, which is linked to the same network. In such way, the signal from the computer terminal may be received by the first circuit board 222 through the network and then transmitted to the second circuit board 24. Consequently, the printing task of the electronic device 2 is controlled by the second circuit board 24.

From the above description, the supporting member, the first circuit board and the first connector are integrated as a modularized structure. The communication module can be quickly dissembled from the electronic device or assembled into the electronic device. Even if the user disassembles the communication module at the first time, the user can realize the operating way easily. In other words, the process disassembling the communication module from the electronic device and the process for assembling the communication module into the electronic device are more time-saving and user-friendly.

Moreover, since the fixing element is not detached from the fixing plate, the possibility of losing components during the process of operating the electronic device will be minimized. As a consequence, the communication module of the electronic device can be disassembled or replaced in a convenient and fast manner.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with a detachable communication module, said electronic device comprising:
    an electronic device casing comprising a receiving space and an opening; and
    said communication module comprising:
        a supporting member comprising a covering plate and a fixing plate, wherein said covering plate has an aperture, and said fixing plate is extended from said covering plate for fixing said communication module on said electronic device casing;
        a first circuit board connected with said supporting member; and
        a first connector connected with said first circuit board, and comprising a connecting port, wherein said connecting port is exposed to said aperture of said covering plate,
        wherein after said first circuit board and said first connector are placed within said receiving space, said opening is covered by said covering plate.

2. The electronic device according to claim 1, further comprising:
- a second connector located at a distal end of said receiving space; and
- a second circuit board connected with said second connector for controlling operations of said electronic device,
- wherein when said first circuit board is introduced into said receiving space, said first circuit board is connected with said second connector, so that said first circuit board is electrically connected with said second circuit board.

3. The electronic device according to claim 2, wherein said first circuit board is a network card, and said second circuit board is a motherboard of said electronic device.

4. The electronic device according to claim 1, further comprising two sliding grooves, which are disposed within said receiving space, wherein when said first circuit board is introduced into said receiving space, both sides of said first circuit board are respectively moved along said two sliding grooves to be accommodated within said receiving space.

5. The electronic device according to claim 1, wherein said first circuit board of said communication module has a fixing hole.

6. The electronic device according to claim 5, wherein said supporting member of said communication module further comprises:
- a fastening part located under said fixing plate and embedded into said fixing hole of said first circuit board; and
- two lateral plates respectively extended from bilateral sides of said covering plate for fixing a location of said first circuit board.

7. The electronic device according to claim 1, wherein said fixing plate further comprises a perforation.

8. The electronic device according to claim 7, wherein said communication module further comprises a fixing element, which is accommodated within said perforation of said fixing plate, wherein said fixing element comprises:
- a screw head part, wherein an outer perimeter of said screw head part is larger than an inner perimeter of said perforation;
- a connecting part extended from said screw head part and disposed within said perforation, wherein an outer perimeter of said connecting part is smaller than said inner perimeter of said perforation; and
- a thread part extended from said connecting part, wherein an outer perimeter of said thread part is larger than said inner perimeter of said perforation.

9. The electronic device according to claim 8, further comprising a screwing hole, which is located over said receiving space, wherein said thread part of said fixing element is penetrated through said screwing hole, so that said communication module is fixed on said electronic device casing.

10. The electronic device according to claim 1, wherein said electronic device is a label printer.

* * * * *